(12) United States Patent
Kondo

(10) Patent No.: US 9,966,980 B2
(45) Date of Patent: May 8, 2018

(54) TRANSMISSION MODULE AND TRANSMISSION AND RECEPTION MODULE

(71) Applicant: Murata Manufacturing Co., Ltd., Kyoto (JP)

(72) Inventor: Masao Kondo, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days. days.

(21) Appl. No.: 15/696,522

(22) Filed: Sep. 6, 2017

(65) Prior Publication Data

US 2018/0069574 A1 Mar. 8, 2018

(30) Foreign Application Priority Data

Sep. 7, 2016 (JP) ................................. 2016-174726

(51) Int. Cl.

| H01Q 11/12 | (2006.01) |
|---|---|
| H04B 1/04 | (2006.01) |
| H04B 1/00 | (2006.01) |
| H03F 3/195 | (2006.01) |
| H03F 1/02 | (2006.01) |
| H03F 1/56 | (2006.01) |
| H03F 3/24 | (2006.01) |

(52) U.S. Cl.
CPC ............. *H04B 1/04* (2013.01); *H03F 1/0216* (2013.01); *H03F 1/56* (2013.01); *H03F 3/195* (2013.01); *H03F 3/245* (2013.01); *H04B 1/005* (2013.01); *H03F 2200/111* (2013.01); *H03F 2200/318* (2013.01); *H03F 2200/387* (2013.01); *H03F 2200/451* (2013.01)

(58) Field of Classification Search
CPC ......... H04B 1/04; H04B 1/005; H03F 1/0216; H03F 1/56; H03F 3/195; H03F 3/245; H03F 2200/111; H03F 2200/318; H03F 2200/387; H03F 2200/451
See application file for complete search history.

(56) References Cited

U.S. PATENT DOCUMENTS

| 2002/0175764 A1* | 11/2002 | Matsuura | H03F 1/0227 330/302 |
|---|---|---|---|
| 2004/0251984 A1* | 12/2004 | Javor | H03F 1/56 333/32 |
| 2014/0285262 A1* | 9/2014 | Kojima | H03F 1/56 330/127 |
| 2016/0080012 A1 | 3/2016 | Sun et al. | |
| 2016/0094192 A1 | 3/2016 | Khesbak et al. | |
| 2017/0063413 A1 | 3/2017 | Ripley et al. | |

* cited by examiner

*Primary Examiner* — Nguyen Vo
(74) *Attorney, Agent, or Firm* — Pearne and Gordon LLP

(57) ABSTRACT

A transmission module includes an amplifier that amplifies a plurality of transmission signals in different frequency bands, a power supply voltage regulator circuit that supplies different power supply voltages for the respective frequency bands of the transmission signals to the amplifier, and a variable matching circuit including at least one variable capacitor element and at least one fixed inductor element. The variable matching circuit satisfies different output impedance matching conditions of the amplifier for the respective frequency bands of the transmission signals by changing a capacitance value of the at least one variable capacitor element on the basis of a change in the output impedance matching conditions of the amplifier in response to a change in the power supply voltages supplied to the amplifier.

10 Claims, 9 Drawing Sheets

TRANSMISSION MODULE AND TRANSMISSION AND RECEPTION MODULE

This application claims priority from Japanese Patent Application No. 2016-174726 filed on Sep. 7, 2016. The content of this application is incorporated herein by reference in its entirety.

BACKGROUND

The present disclosure relates to a transmission module and a transmission and reception module.

A multi-band system that enables a single transmission module to support a plurality of frequency bands has been studied over recent years. In light of this situation, U.S. Patent Application Publication No. 2016/0094192 discloses a transmission module supporting such a multi-band system. In the transmission module, combinations of output impedance matching circuits and power amplifiers, each of which is optimized to amplify signals in a predetermined frequency band, are provided in parallel for individual frequency bands. Signal paths for transmission signals of different frequencies whose powers are amplified by the power amplifiers are switched in a time-division manner by a band switch.

However, if combinations of output impedance matching circuits and power amplifiers, each of which is optimized to amplify signals in a predetermined frequency band, are provided for respective frequency bands, the number of elements in the power amplifiers and the output impedance matching circuits is large. In addition, the transmission module has a large area. Thus, it is difficult to meet the demand for reduced size of a mobile communication device including the transmission module.

BRIEF SUMMARY

Accordingly, the present disclosure provides a transmission module that can support a multi-band system without necessarily an increase in the number of elements used.

According to embodiments of the present disclosure, a transmission module includes (i) an amplifier that amplifies a plurality of transmission signals in different frequency bands, (ii) a power supply voltage regulator circuit that supplies different power supply voltages for the respective frequency bands of the transmission signals to the amplifier, and (iii) a variable matching circuit including at least one variable capacitor element. The variable matching circuit includes no variable inductor element. The variable matching circuit satisfies different output impedance matching conditions of the amplifier for the respective frequency bands of the transmission signals by changing a capacitance value of the at least one variable capacitor element on the basis of a change in the output impedance matching conditions of the amplifier in response to a change in the power supply voltages supplied to the amplifier.

According to embodiments of the present disclosure, a transmission module can support a multi-band system without necessarily an increase in the number of elements used.

Other features, elements, characteristics and advantages of the present disclosure will become more apparent from the following detailed description of embodiments of the present disclosure with reference to the attached drawings.

DETAILED DESCRIPTION

Embodiments of the present disclosure will be described hereinafter with reference to the drawings. The same numerals are used to indicate the same or substantially the same circuit elements and no repeated description is given.

Figure 1:
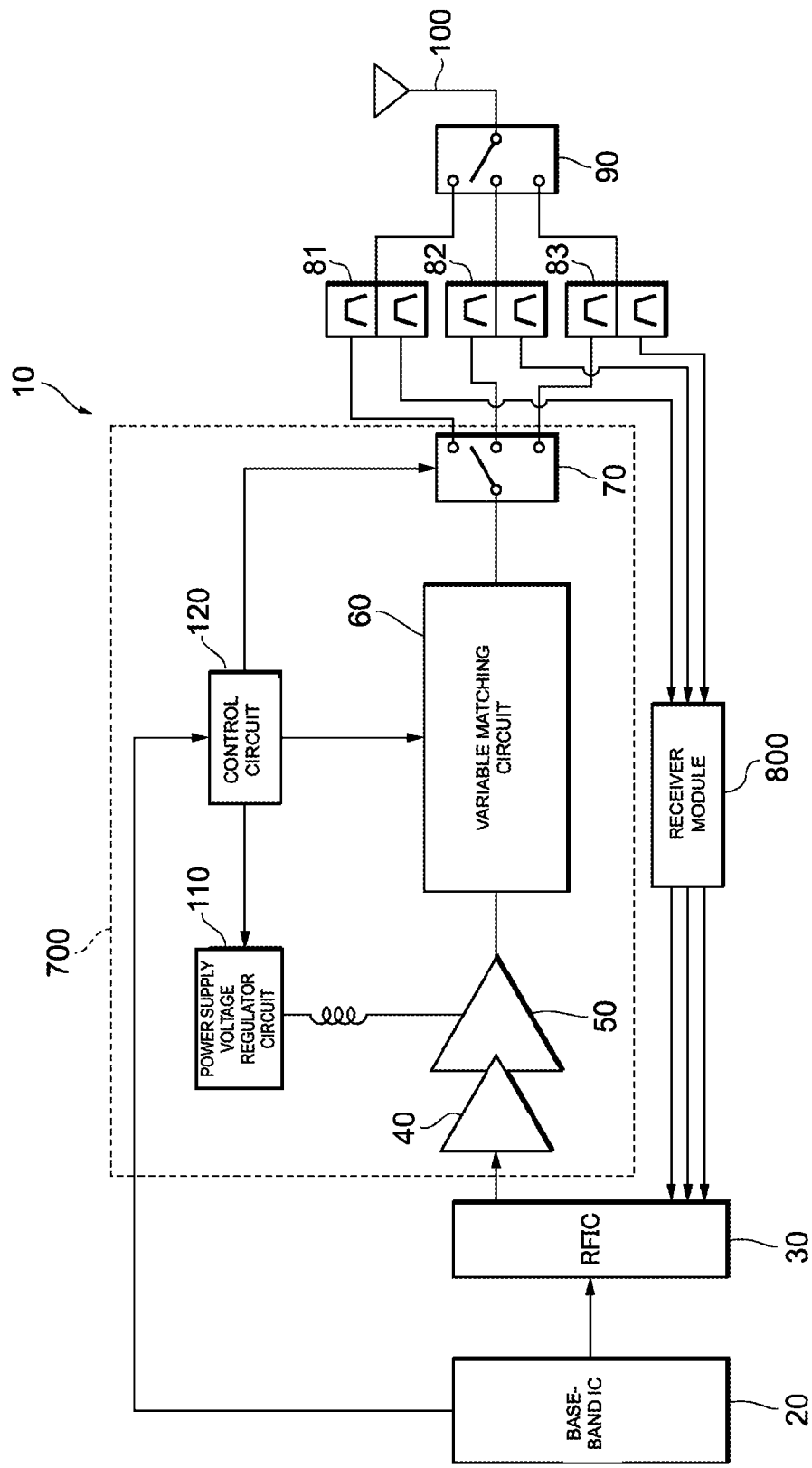
FIG. 1 illustrates a circuit configuration of a transmission and reception module according to a first embodiment of the present disclosure.
Figure 9:
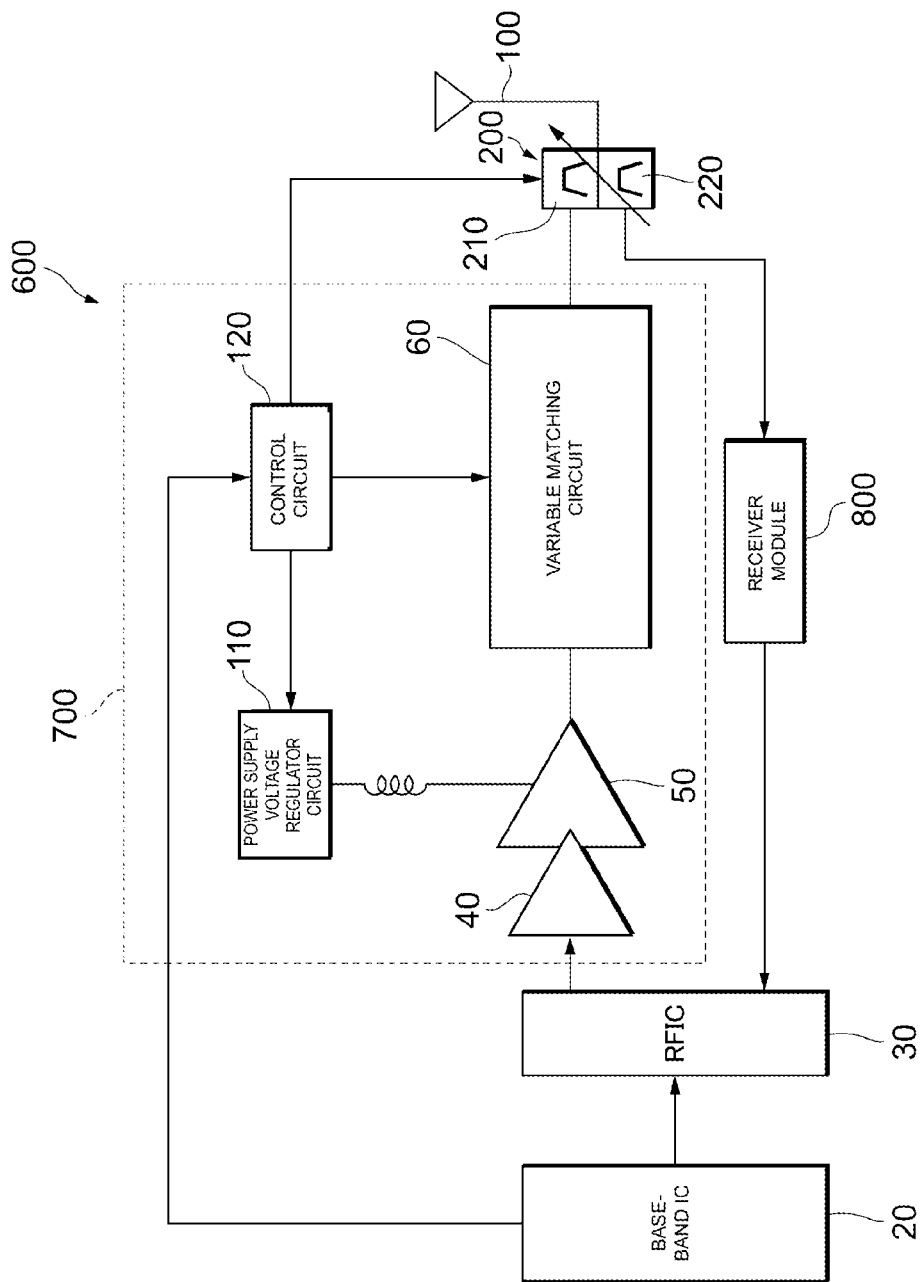
FIG. 9 illustrates a circuit configuration of a transmission and reception module according to a fifth embodiment of the present disclosure.

FIG. 1 illustrates a circuit configuration of a transmission and reception module 10 according to a first embodiment of the present disclosure. The transmission and reception module 10 supports a multi-band system and is included in a mobile communication device such as a cellular phone to transmit and receive radio frequency (RF) signals in a plurality of frequency bands to and from a base station. The transmission and reception module 10 includes a transmission module 700, a reception module 800, a baseband integrated circuit (IC) 20, a radio frequency integrated circuit (RFIC) 30, duplexers (separators) 81, 82, and 83, an antenna switch 90, and an antenna 100. The transmission module 700 is a module for amplifying the power of a transmission signal and also serves as a power amplifier module. The transmission module 700 includes amplifiers 40 and 50, a variable matching circuit 60, a band switch 70, a power supply voltage regulator circuit 110, and a control circuit 120. The band switch 70 is optional to the transmission module 700. As illustrated in FIG. 9, the transmission module 700 may not include the band switch 70. In this embodiment, the amplifiers 40 and 50 are used in two stages. The number of stages in which the amplifiers 40 and 50 are used may be determined as desired in accordance with the output of a transmission signal. The reception module 800 is a module for low-noise amplifying a reception signal and includes a low-noise amplifier.

The baseband IC 20 generates a first baseband signal by performing digital signal processing. The first baseband signal is used to generate a first transmission signal in a first frequency band (for example, the 700 MHz band). The baseband IC 20 generates a second baseband signal by performing digital signal processing. The second baseband signal is used to generate a second transmission signal in a second frequency band (for example, the 800 MHz band). The baseband IC 20 generates a third baseband signal by performing digital signal processing. The third baseband signal is used to generate a third transmission signal in a third frequency band (for example, the 900 MHz band). The RFIC 30 modulates a carrier wave in accordance with information superimposed on the first, second, and third baseband signals generated by the baseband IC 20 to respectively generate first, second, and third transmission signals, and outputs the generated transmission signals in a time-division manner. The first, second, and third transmission signals are RF signals in different frequency bands.

The term "transmission signals", as used herein, collectively refers to the first, second, and third transmission signals, and the term "transmission signal" is used to indicate each of the first, second, and third transmission signals unless they are individually identified. The same applies to the terms "reception signals" and "reception signal" described below.

The amplifiers 40 and 50 amplify the first, second, and third transmission signals output in a time-division manner from the RFIC 30. The amplifier 50 functions as an output-stage amplifier, and the amplifier 40 functions as a driver-stage amplifier connected to the stage preceding the amplifier 50. The control circuit 120 receives frequency information and power mode information from the baseband IC 20. The frequency information indicates the frequencies of the respective transmission signals, and the power mode information indicates the transmission output levels of the respective transmission signals. The control circuit 120 controls the power supply voltage regulator circuit 110 so that the power supply voltage to be supplied from the power supply voltage regulator circuit 110 to the amplifier 50 is regulated on the basis of the frequency information and power mode information received from the baseband IC 20. The power supply voltage regulator circuit 110 is, for example, a DC/DC converter for boosting or stepping down a direct-current (DC) voltage serving as a power supply voltage to be supplied to the amplifier 50. Table 1 gives an example of power supply voltages for the amplifier 50 that are regulated on the basis of frequency information and power mode information. The control circuit 120 may control the power supply voltage regulator circuit 110 so that the power supply voltage to be supplied from the power supply voltage regulator circuit 110 to the amplifier 50 is regulated on the basis of frequency information and power mode information received from the RFIC 30 instead of from the baseband IC 20.

TABLE 1

| Power mode | Frequency band | | |
|---|---|---|---|
| | 700 MHz band | 800 MHz band | 900 MHz band |
| High-output mode | 7.2 V | 7 V | 6.8 V |
| Medium-output mode | 5.15 V | 5 V | 4.85 V |
| Low-output mode | 3.1 V | 3 V | 2.9 V |

In the example given in Table 1, power modes are divided into three levels of a "high-output mode", a "medium-output mode", and a "low-output mode". A power supply voltage for the amplifier 50 which is required to amplify transmission signals in an identical frequency band is set to a higher voltage value for a higher transmission output level. On the other hand, a power supply voltage for the amplifier 50 which is required to amplify transmission signals with an identical transmission output level is set to a lower voltage value for a higher transmission frequency. As given in Table 1, the rates of change of the power supply voltage for the amplifier 50 over the frequency range from the 700 MHz band to the 900 MHz band are as low as 0.2 V to 0.4 V or less. When the absolute value of the power supply voltage for the amplifier 50 has an error, the deterioration of accuracy of the variable matching circuit 60 is not small even if the error is small. As also given in Table 1, the higher the power supply voltage for the amplifier 50 is, the higher the rate of change of the power supply voltage for the amplifier 50 due to the difference in frequency band is. Thus, a higher power supply voltage for the amplifier 50 can suppress the deterioration of accuracy of the variable matching circuit 60 more when the absolute value of the power supply voltage for the amplifier 50 has an error. In a typical mobile communication device, the transmission and reception module 10 has a battery voltage of about 3 V to 4 V. It is thus desirable that the power supply voltage regulator circuit 110 have a function of boosting each of the power supply voltages supplied to the amplifier 50 to a level higher than the battery voltage. In this embodiment, the power supply voltage regulator circuit 110 having such a boosting function is employed.

The variable matching circuit 60 is configured to satisfy different output impedance matching conditions of the amplifier 50 for the frequency bands of transmission signals, on the basis of a change in the output impedance matching conditions of the amplifier 50 in response to a change in the power supply voltages supplied to the amplifier 50. The variable matching circuit 60 includes one or more inductor elements and one or more capacitor elements. At least one of the one or more capacitor elements is a variable capacitor element, or at least one of the one or more inductor elements is a variable inductor element. The variable matching circuit 60 may have the so-called T-type, π-type, or L-type circuit configuration, for example, and one of an inductor element and a capacitor element may be connected in series with a transmission signal path or may be shunt-connected between the transmission signal path and ground. When the variable matching circuit 60 includes at least one variable capacitor element, the control circuit 120 outputs to the variable matching circuit 60 a control signal for adjusting the capacitance value of the at least one variable capacitor element so that different output impedance matching conditions of the amplifier 50 for the frequency bands of transmission signals are satisfied on the basis of frequency information received from the baseband IC 20. The variable matching circuit 60 adjusts the capacitance value of the variable capacitor element on the basis of the control signal received from the control circuit 120. When the variable matching circuit 60 includes a variable inductor element, the control circuit 120 outputs to the variable matching circuit 60 a control signal for adjusting the inductance value of the variable inductor element so that different output impedance matching conditions of the amplifier 50 for the frequency bands of transmission signals are satisfied on the basis of frequency information received from the baseband IC 20. The variable matching circuit 60 adjusts the inductance value of the variable inductor element on the basis of the control signal received from the control circuit 120. When the variable matching circuit 60 includes a variable capacitor element, the control circuit 120 may output to the variable matching circuit 60 a control signal for adjusting the capacitance value of the variable capacitor element so that different output impedance matching conditions of the amplifier 50 for the frequency bands of transmission signals are satisfied on the basis of frequency information received from the RFIC 30 instead of from the baseband IC 20. When the variable matching circuit 60 includes a variable inductor element, the control circuit 120 may output to the variable matching circuit 60 a control signal for adjusting the inductance value of the variable inductor element so that different output impedance matching conditions of the amplifier 50 for the frequency bands of transmission signals are satisfied on the basis of frequency information received from the RFIC 30 instead of from the baseband IC 20.

The band switch 70 and the antenna switch 90 selectively switch a transmission signal path and a reception signal path in response to switching signals supplied from the control circuit 120. Specifically, a transmission signal path is selectively switched so that the first, second, and third transmission signals output from the amplifiers 40 and 50 are directed to the antenna 100 via the duplexers 81, 82, and 83, respectively. Likewise, a reception signal path is selectively switched so that first, second, and third reception signals received from the antenna 100 are directed to the reception module 800 via the duplexers 81, 82, and 83, respectively. The first, second, and third reception signals are RF signals in different frequency bands. The duplexer 81 is a separator that separates the first transmission signal and the first reception signal from each other. Likewise, the duplexer 82 is a separator that separates the second transmission signal and the second reception signal from each other, and the duplexer 83 is a separator that separates the third transmission signal and the third reception signal from each other. The reception module 800 low-noise amplifies a reception signal and inputs the resulting signal to the RFIC 30. The reception signal input to the RFIC 30 is demodulated into a baseband signal by the baseband IC 20.

Figure 2:
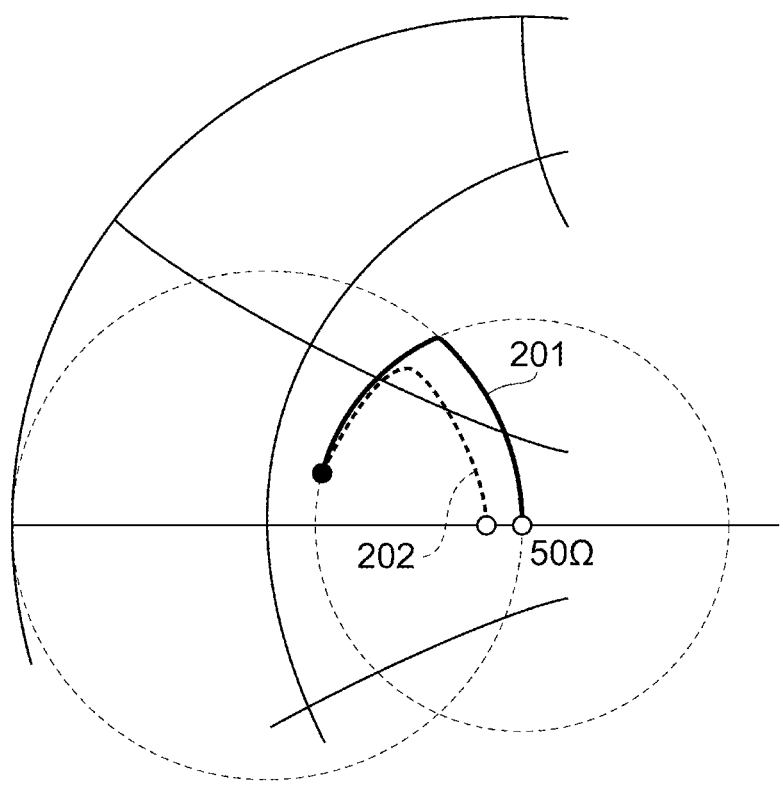
FIG. 2 illustrates simulation results depicting the locus of the impedance of a variable matching circuit on a Smith chart.
Figure 3:
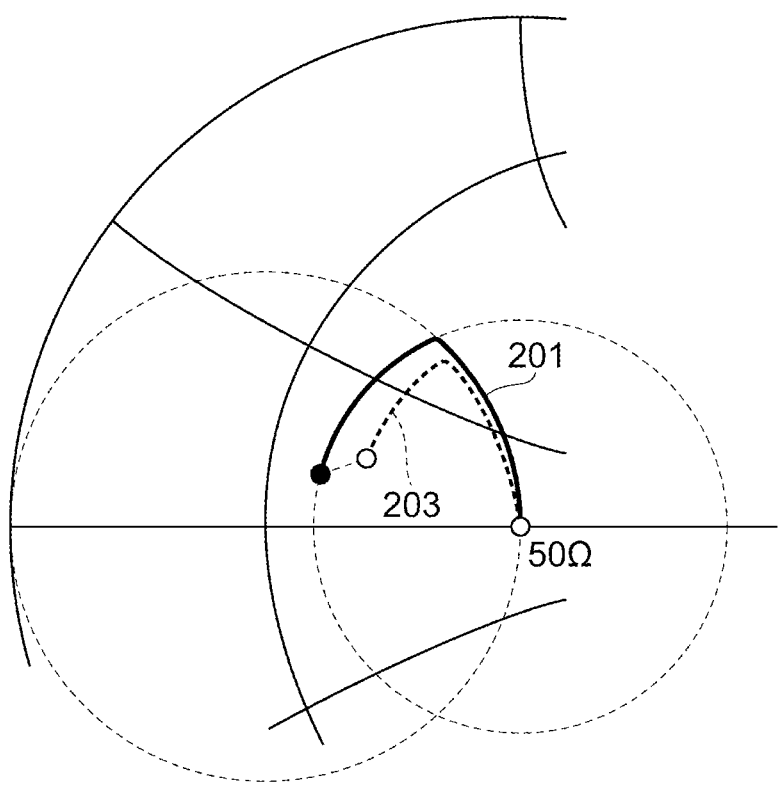
FIG. 3 illustrates simulation results depicting the locus of the impedance of the variable matching circuit on a Smith chart.

Next, a method how different output impedance matching conditions of the amplifier 50 for the frequency bands of transmission signals are satisfied on the basis of a change in the output impedance matching conditions of the amplifier 50 in response to a change in the power supply voltages supplied to the amplifier 50 will be described with reference to FIGS. 2 and 3. FIGS. 2 and 3 illustrate simulation results depicting the locus of the impedance of the variable matching circuit 60 that includes a variable capacitor element on a Smith chart. It is assumed here that a first power supply voltage is set as a power supply voltage for the amplifier 50 which is required to amplify the first transmission signal in the first frequency band and that a second power supply voltage is set as a power supply voltage for the amplifier 50 which is required to amplify the second transmission signal in the second frequency band, where the transmission output levels are constant. In FIGS. 2 and 3, numeral 201 denotes the locus of the impedance of the variable matching circuit 60 on a Smith chart when the capacitance of the variable capacitor element is changed for the first frequency band under a condition where the first power supply voltage is supplied as the power supply voltage for the amplifier 50. In FIG. 2, numeral 202 denotes the locus of the impedance of the variable matching circuit 60 on a Smith chart when the capacitance of the variable capacitor element is changed for the second frequency band under a condition where the first power supply voltage is supplied as the power supply voltage for the amplifier 50. In FIG. 3, numeral 203 denotes the locus of the impedance of the variable matching circuit 60 on a Smith chart when the capacitance of the variable capacitor element is changed for the second frequency band under a condition where the second power supply voltage is supplied as the power supply voltage for the amplifier 50.

The simulation results illustrated in FIG. 2 indicate that, under the condition where the first power supply voltage is supplied as the power supply voltage for the amplifier 50, the capacitance value of the variable capacitor element in the variable matching circuit 60 that satisfies the output impedance matching condition required for the amplifier 50 for the first frequency band is determined. However, under the condition where the first power supply voltage is supplied as the power supply voltage for the amplifier 50, it is difficult to satisfy the output impedance matching condition required for the amplifier 50 for the second frequency band regardless of the capacitance value of the variable capacitor element in the variable matching circuit 60. In contrast, the simulation results illustrated in FIG. 3 indicate that, under the condition where the second power supply voltage is supplied as the power supply voltage for the amplifier 50, the capacitance value of the variable capacitor element in the variable matching circuit 60 that satisfies the output impedance matching condition required for the amplifier 50 for the second frequency band is determined. Accordingly, when the variable matching circuit 60 includes a variable capacitor element, different output impedance matching conditions of the amplifier 50 for the frequency bands of transmission signals can be satisfied by changing the capacitance value of the variable capacitor element on the basis of a change in the output impedance matching conditions of the amplifier 50 in response to a change in the power supply voltages supplied to the amplifier 50. In this case, the capacitance values of the capacitor elements of the variable matching circuit 60, other than the variable capacitor element, may remain fixed to constant values and the inductance values of the inductor elements of the variable matching circuit 60 may remain fixed to constant values. In FIGS. 2 and 3, 50Ω represents matched impedance.

On the basis of a similar principle, when the variable matching circuit 60 includes at least one variable inductor element, different output impedance matching conditions of the amplifier 50 for the frequency bands of transmission signals can be satisfied by changing the inductance value of the at least one variable inductor element on the basis of a change in the output impedance matching conditions of the amplifier 50 in response to a change in the power supply voltages supplied to the amplifier 50. In this case, the inductance values of the inductor elements of the variable matching circuit 60, other than the variable inductor element, may remain fixed to constant values, and the capacitance values of the capacitor elements of the variable matching circuit 60 may remain fixed to constant values. The variable matching circuit 60 may include both a variable capacitor element and a variable inductor element. Different output impedance matching conditions of the amplifier 50 for the frequency bands of transmission signals can also be satisfied by changing both the capacitance value of the variable capacitor element and the inductance value of the variable inductor element in accordance with a change in the output impedance matching conditions of the amplifier 50 in response to a change in the power supply voltages supplied to the amplifier 50.

Figure 4:
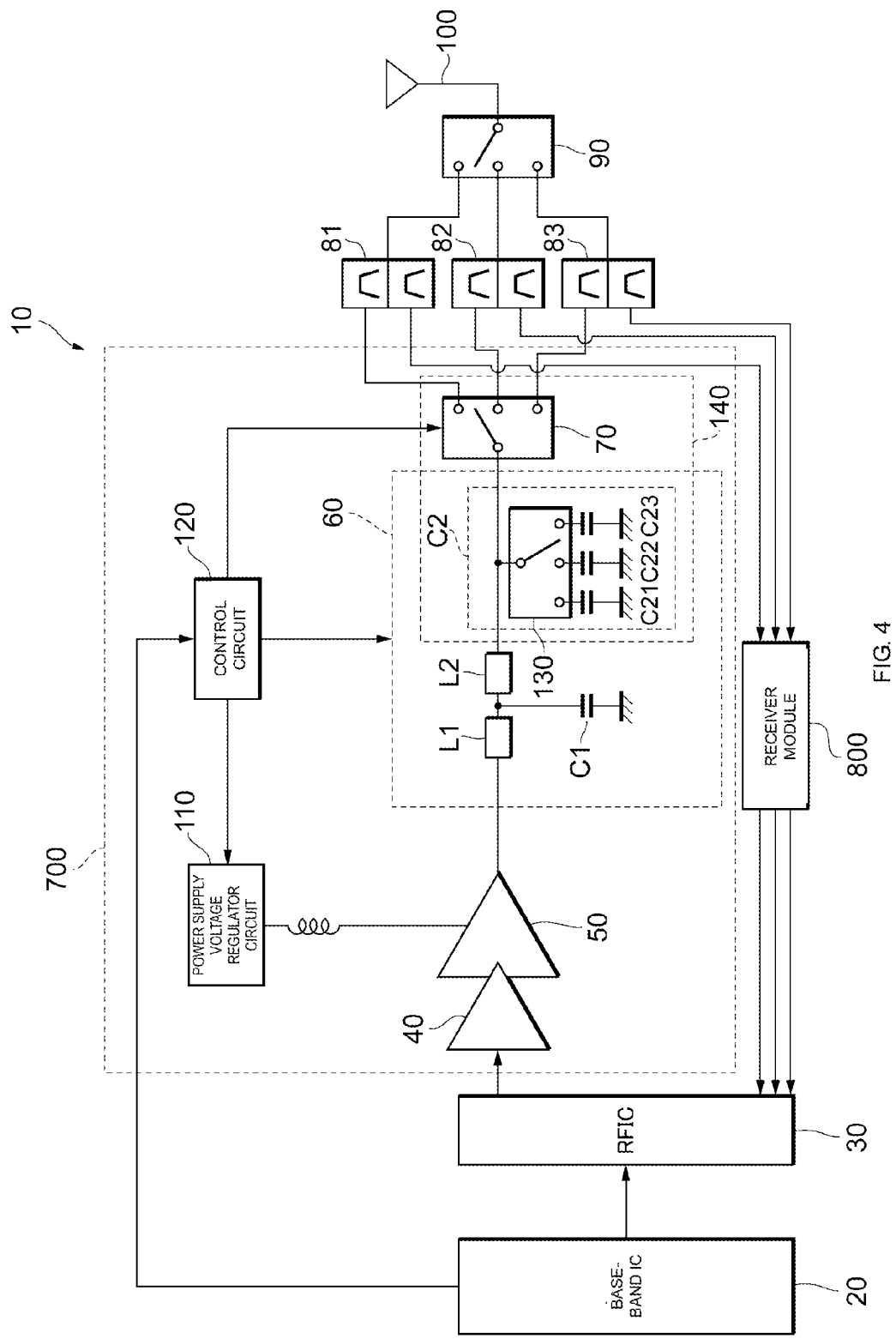
FIG. 4 illustrates a circuit configuration of the transmission and reception module according to the first embodiment of the present disclosure.

FIG. 4 illustrates the circuit configuration of the transmission and reception module 10 that includes a variable capacitor element as a circuit element of the variable matching circuit 60. The variable matching circuit 60 includes inductor elements L1 and L2, which are connected in series with the transmission signal path, and capacitor elements C1 and C2, which are shunt-connected between the transmission signal path and ground. The inductor elements L1 and L2 are fixed inductor elements whose inductance values are fixed to constant values. The capacitor element C1 is a fixed capacitor element whose capacitance value is fixed to a constant value. The capacitor element C2 is a variable capacitor element including a plurality of fixed capacitor elements C21, C22, and C23 having different capacitance values, and a switch 130 that selectively switches the connections between the transmission signal path and the fixed capacitor elements C21, C22, and C23. Note that the variable matching circuit 60 illustrated in FIG. 4 includes no variable inductor element. In FIG. 4, by way of example, the number of fixed capacitor elements C21, C22, and C23 is equal to the number of frequency bands of transmission signals. The number of fixed capacitor elements included in the capacitor element C2 may be larger than the number of frequency bands of transmission signals. The fixed inductor elements L1 and L2 are optional to the variable matching circuit 60 and may not be included in the variable matching circuit 60. The control circuit 120 outputs to the switch 130 a control signal for selecting a fixed capacitor element to be connected to the signal path from among the plurality of fixed capacitor elements C21, C22, and C23 so that different output impedance matching conditions of the amplifier 50 for the frequency bands of transmission signals are satisfied on the basis of frequency information received from the baseband IC 20. The switch 130 connects the selected fixed capacitor element to the signal path on the basis of the control signal received from the control circuit 120. The fixed capacitor elements C21, C22, and C23 have capacitance values of, for example, 3.5 pF, 3.3 pF, and 3.1 pF, respectively. The capacitor element C21 is selected for amplifying the first transmission signal in the first frequency band (for example, the 700 MHz band). The capacitor element C22 is selected for amplifying the second transmission signal in the second frequency band (for example, the 800 MHz band). The capacitor element C23 is selected for amplifying the third transmission signal in the third frequency band (for example, the 900 MHz band). As given in Table 2, the higher the frequency band of the transmission signal, the smaller the capacitance value of the fixed capacitor element to be selected.

TABLE 2

| Power mode | Frequency band | | |
| --- | --- | --- | --- |
|  | 700 MHz band | 800 MHz band | 900 MHz band |
| All output modes | 3.5 pF | 3.3 pF | 3.1 pF |

In the example given in Table 2, the capacitance value of the variable capacitor element in the variable matching circuit 60 is set to a constant value for all the power modes, in common, to amplify transmission signals in an identical frequency band, for convenience of description. The capacitance value of the variable capacitor element in the variable matching circuit 60 may be changed in accordance with the power mode even when transmission signals in an identical frequency band are amplified.

As indicated by numeral 140, the capacitor element C2 serving as a variable capacitor element and the band switch 70 are formed on an identical semiconductor substrate by using integration technology such as monolithic microwave integrated circuit technology, which can lead to a reduction in module area.

Figure 5:
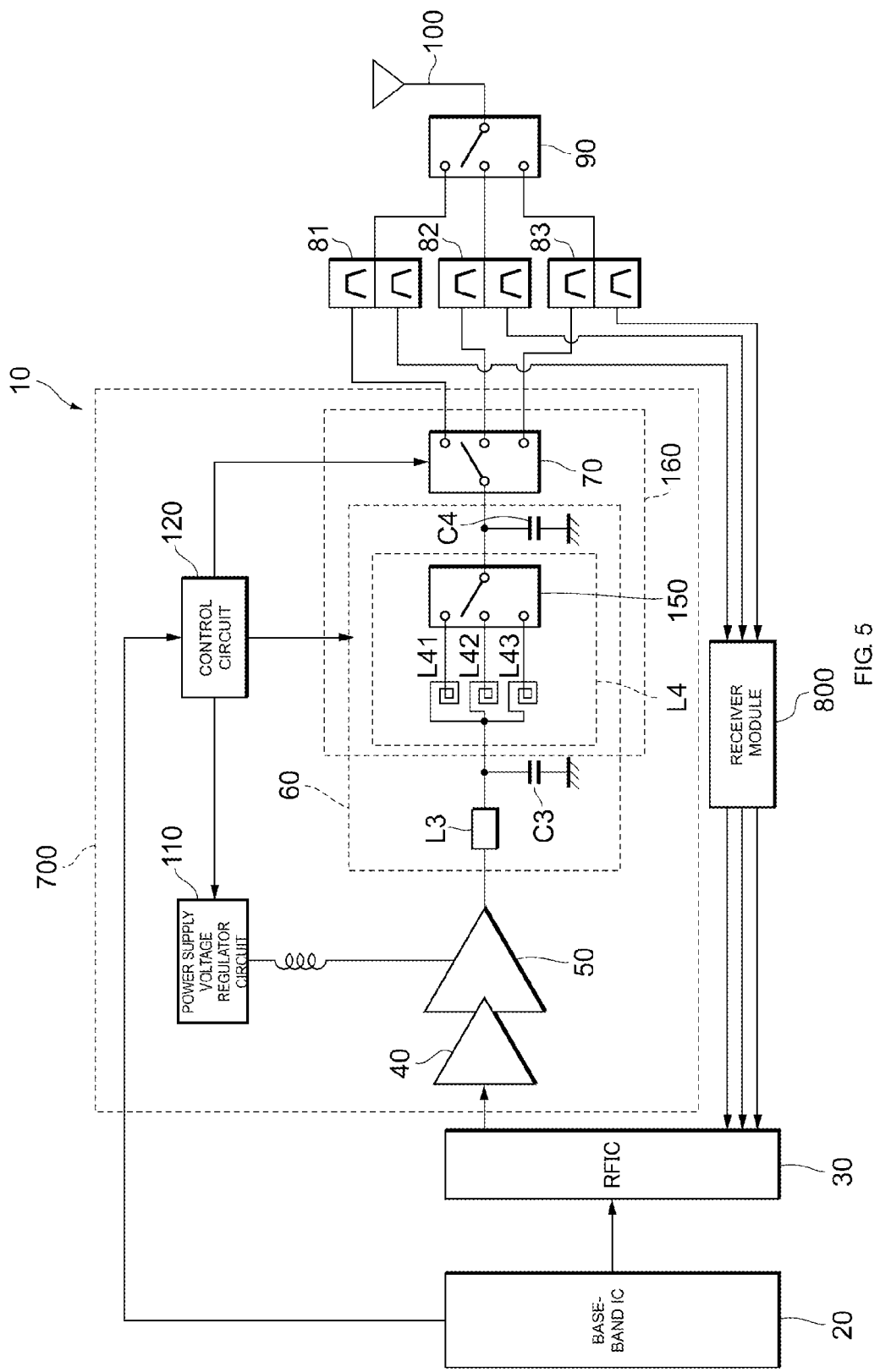
FIG. 5 illustrates a circuit configuration of the transmission and reception module according to the first embodiment of the present disclosure.

FIG. 5 illustrates the circuit configuration of the transmission and reception module 10 that includes a variable inductor element as a circuit element of the variable matching circuit 60. The variable matching circuit 60 includes inductor elements L3 and L4, which are connected in series with the transmission signal path, and capacitor elements C3 and C4, which are shunt-connected between the transmission signal path and ground. The inductor element L3 is a fixed inductor element whose inductance value is fixed to a constant value. The capacitor elements C3 and C4 are fixed capacitor elements whose capacitance values are fixed to constant values. The inductor element L4 is a variable inductor element including a plurality of fixed inductor elements L41, L42, and L43 having different inductance values, and a switch 150 that selectively switches the connections between the transmission signal path and the fixed inductor elements L41, L42, and L43. Note that the variable matching circuit 60 illustrated in FIG. 5 includes no variable capacitor element. In FIG. 5, by way of example, the number of fixed inductor elements L41, L42, and L43 is equal to the number of frequency bands of transmission signals. The number of fixed inductor elements included in the inductor element L4 may be larger than the number of frequency bands of transmission signals. The fixed capacitor elements C3 and C4 are optional to the variable matching circuit 60 and may not be included in the variable matching circuit 60. The control circuit 120 outputs to the switch 150 a control signal for selecting a fixed inductor element to be connected to the signal path from among the plurality of fixed inductor elements L41, L42, and L43 so that different output impedance matching conditions of the amplifier 50 for the frequency bands of transmission signals are satisfied on the basis of frequency information received from the baseband IC 20. The switch 150 connects the selected fixed inductor element to the signal path on the basis of the control signal received from the control circuit 120. The inductor elements L41, L42, and L43 have inductance values of, for example, 3.8 nH, 4 nH, and 4.2 nH, respectively. The inductor element L41 is selected for amplifying the first transmission signal in the first frequency band (for example, the 700 MHz band). The inductor element L42 is selected for amplifying the second transmission signal in the second frequency band (for example, the 800 MHz band). The inductor element L43 is selected for amplifying the third transmission signal in the third frequency band (for example, the 900 MHz band). As given in Table 3, the higher the frequency band of the transmission signal, the larger the inductance value of the inductor element to be selected.

TABLE 3

| Power mode | Frequency band | | |
| --- | --- | --- | --- |
|  | 700 MHz band | 800 MHz band | 900 MHz band |
| All output modes | 3.8 nH | 4 nH | 4.2 nH |

In the example given in Table 3, the inductance value of the variable inductor element in the variable matching circuit 60 is set to a constant value for all the power modes, in common, to amplify transmission signals in an identical frequency band, for convenience of description. The inductance value of the variable inductor element in the variable matching circuit 60 may be changed in accordance with the power mode even when transmission signals in an identical frequency band are amplified.

As indicated by numeral 160, the inductor element L4 serving as a variable inductor element and the band switch 70 are formed on an identical semiconductor substrate by using integration technology such as monolithic microwave integrated circuit technology, which can lead to a reduction in module area.

In the transmission module 700 according to the first embodiment, the variable matching circuit 60 can satisfy different output impedance matching conditions of the amplifier 50 for the frequency bands of transmission signals by changing the capacitance value of the variable capacitor element or the inductance value of the variable inductor element on the basis of a change in the output impedance matching conditions of the amplifier 50 in response to a change in the power supply voltages supplied to the amplifier 50. This eliminates the need for combinations of output impedance matching circuits and power amplifiers, each of which is optimized to amplify signals in a predetermined frequency band, to be provided for respective frequency bands, thereby reducing the number of elements in the transmission module 700, which further contributes to a reduction in the size of the transmission module 700. In addition, the variable matching circuit 60 can satisfy different output impedance matching conditions of the amplifier 50 for the frequency bands of transmission signals by adjusting either the inductance value of the variable inductor element or the capacitance value of the variable capacitor element. This eliminates the need to adjust both the inductance value of the variable inductor element and the capacitance value of the variable capacitor element. Thus, the circuit configuration of the variable matching circuit 60 can be simplified. Furthermore, formation of the band switch 70 and the capacitor element C2 serving as a variable capacitor element on an identical semiconductor substrate can reduce the module area. Alternatively, formation of the band switch 70 and the inductor element L4 serving as a variable inductor element on an identical semiconductor substrate can reduce the module area.

Figure 6:
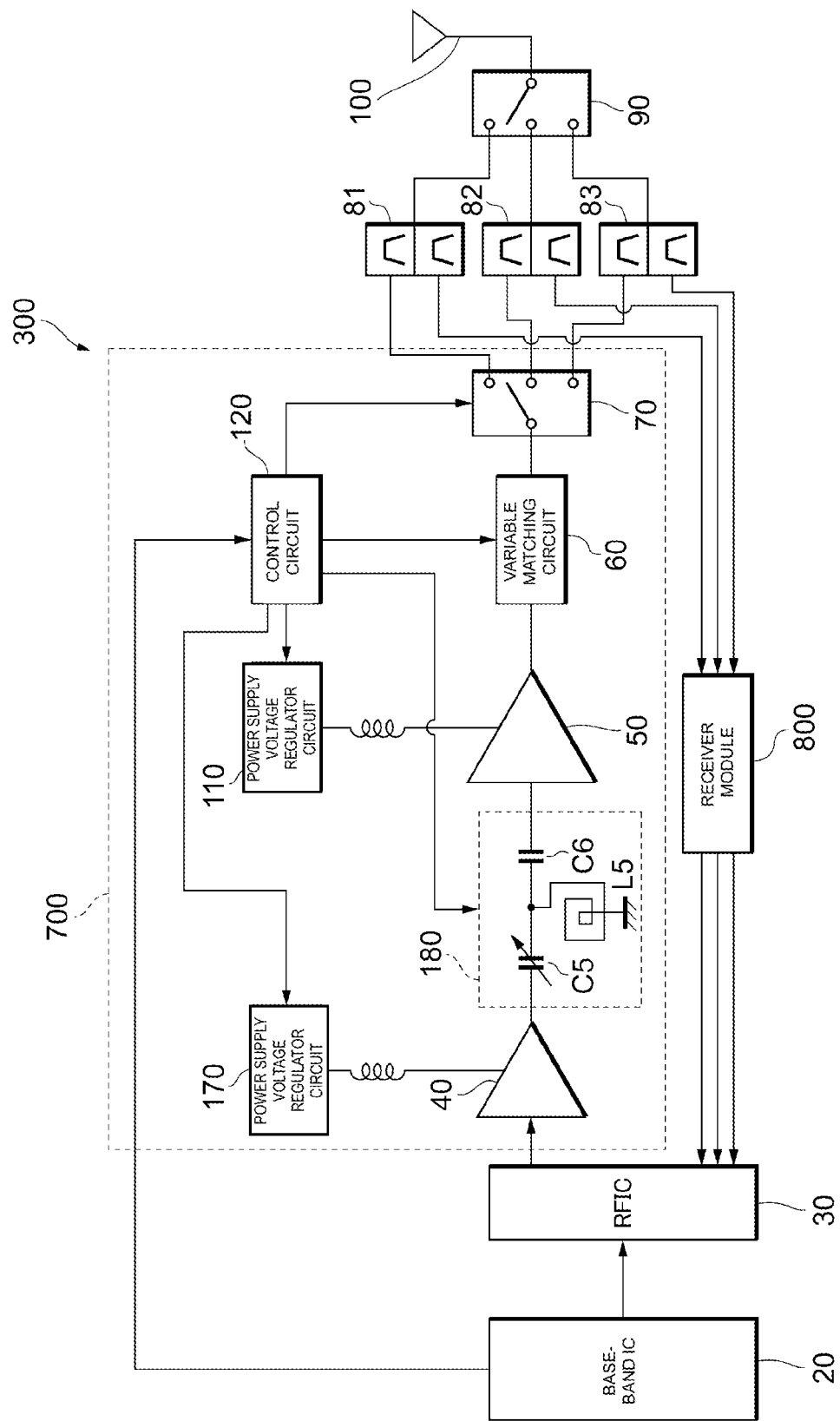
FIG. 6 illustrates a circuit configuration of a transmission and reception module according to a second embodiment of the present disclosure.

FIG. 6 illustrates the circuit configuration of a transmission and reception module 300 according to a second embodiment of the present disclosure. The same numerals as those illustrated in FIG. 1 are used to indicate the same or substantially the same circuit elements, and the following description focuses on the difference between the first and second embodiments. A transmission module 700 according to the second embodiment is different from the transmission module 700 according to the first embodiment in that the transmission module 700 according to the second embodiment includes a power supply voltage regulator circuit 170 and a variable matching circuit 180. The control circuit 120 receives frequency information and power mode information from the baseband IC 20. The frequency information indicates the frequencies of the respective transmission signals, and the power mode information indicates the transmission output levels of the respective transmission signals. The control circuit 120 controls the power supply voltage regulator circuit 110 so that the power supply voltage to be supplied from the power supply voltage regulator circuit 110 to the amplifier 50 is regulated on the basis of the frequency information and power mode information received from the baseband IC 20. Likewise, the control circuit 120 controls the power supply voltage regulator circuit 170 so that the power supply voltage to be supplied from the power supply voltage regulator circuit 170 to the amplifier 40 is regulated on the basis of the frequency information and power mode information received from the baseband IC 20. The power supply voltage regulator circuit 170 is, for example, a DC/DC converter for boosting or stepping down a direct-current (DC) voltage serving as a power supply voltage to be supplied to the amplifier 40. Table 4 gives an example of power supply voltages for the amplifier 40 that are regulated on the basis of frequency information and power mode information. The control circuit 120 may control the power supply voltage regulator circuit 170 so that the power supply voltage to be supplied from the power supply voltage regulator circuit 170 to the amplifier 40 is regulated on the basis of frequency information and power mode information received from the RFIC 30 instead of from the baseband IC 20.

TABLE 4

| Power mode | Frequency band | | |
| --- | --- | --- | --- |
| | 700 MHz band | 800 MHz band | 900 MHz band |
| All output modes | 3.3 V | 3.4 V | 3.5 V |

In the example given in Table 4, a power supply voltage for the amplifier 40 which is required to amplify a transmission signal is set to a higher voltage value for a higher transmission frequency. By way of example, the power supply voltage for the amplifier 40 is set to a constant value for all the power modes, in common, to amplify transmission signals in an identical frequency band, for convenience of description. The power supply voltage for the amplifier 40 may be changed in accordance with the power mode even when transmission signals in an identical frequency band are amplified.

The variable matching circuit 180 is designed to satisfy different impedance matching conditions between the amplifier 40 and the amplifier 50 for the frequency bands of transmission signals, on the basis of a change in the impedance matching conditions between the amplifier 40 and the amplifier 50 in response to a change in the power supply voltages supplied to the amplifier 40. The variable matching circuit 180 includes capacitor elements C5 and C6, which are connected in series with the transmission signal path, and an inductor element L5, which is shunt-connected between the transmission signal path and ground. The capacitor element C6 is a fixed capacitor element whose capacitance value is fixed to a constant value. The inductor element L5 is a fixed inductor element whose inductance value is fixed to a constant value. The capacitor element C5 is a variable capacitor element whose capacitance value can be changed on the basis of the control signal received from the control circuit 120. Note that the variable matching circuit 180 illustrated in FIG. 6 includes no variable inductor element. The control circuit 120 outputs to the variable matching circuit 180 a control signal for adjusting the capacitance value of the variable capacitor element C5 in the variable matching circuit 180 so that different impedance matching conditions between the amplifier 40 and the amplifier 50 for the frequency bands of transmission signals are satisfied on the basis of frequency information received from the baseband IC 20. The variable matching circuit 180 adjusts the capacitance value of the variable capacitor element C5 on the basis of the control signal received from the control circuit 120. As given in Table 5, the variable matching circuit 180 adjusts the capacitance value of the variable capacitor element C5 to 18 pF, for example, for amplifying the first transmission signal in the first frequency band (for example, the 700 MHz band). The variable matching circuit 180 adjusts the capacitance value of the variable capacitor element C5 to 15 pF, for example, for amplifying the second transmission signal in the second frequency band (for example, the 800 MHz band). The variable matching circuit 180 adjusts the capacitance value of the variable capacitor element C5 to 12 pF, for example, for amplifying the third transmission signal in the third frequency band (for example, the 900 MHz band). As given in Table 5, the higher the frequency band of the transmission signal, the smaller the capacitance value of the variable capacitor element C5 in the variable matching circuit 180. The control circuit 120 may output to the variable matching circuit 180 a control signal for adjusting the capacitance value of the variable capacitor element C5 in the variable matching circuit 180 so that different impedance matching conditions between the amplifier 40 and the amplifier 50 for the frequency bands of transmission signals are satisfied on the basis of frequency information received from the RFIC 30 instead of from the baseband IC 20.

TABLE 5

| Power mode | Frequency band | | |
| --- | --- | --- | --- |
| | 700 MHz band | 800 MHz band | 900 MHz band |
| All output modes | 18 pF | 15 pF | 12 pF |

In the example given in Table 5, the capacitance value of the variable capacitor element C5 in the variable matching circuit 180 is set to a constant value for all the power modes, in common, to amplify transmission signals in an identical frequency band, for convenience of description. The capacitance value of the variable capacitor element C5 may be changed in accordance with the power mode even when transmission signals in an identical frequency band are amplified.

The circuit configuration of the variable matching circuit 180 is not limited to the circuit configuration illustrated in FIG. 6. For example, the variable matching circuit 180 may include one or more inductor elements and one or more capacitor elements so long as at least one of the one or more capacitor elements is a variable capacitor element or at least one of the one or more inductor elements is a variable inductor element. The variable matching circuit 180 may include, for example, at least one variable capacitor element and at least one fixed inductor element, but may not necessarily include a variable inductor element. Alternatively, the variable matching circuit 180 may include at least one fixed capacitor element and at least one variable inductor element, but may not necessarily include a variable capacitor element. The variable matching circuit 180 may have the so-called T-type, π-type, or L-type circuit configuration, for example, and one of an inductor element and a capacitor element may be connected in series with a transmission signal path or may be shunt-connected between the transmission signal path and ground. In this case, the control circuit 120 outputs to the variable matching circuit 180 a control signal for adjusting the capacitance value of at least one variable capacitor element or the inductance value of at least one variable inductor element so that different impedance matching conditions between the amplifier 40 and the amplifier 50 for the frequency bands of transmission signals are satisfied on the basis of frequency information received from the baseband IC 20. In response to the control signal received from the control circuit 120, the variable matching circuit 180 adjusts the capacitance value of the variable capacitor element or the inductance value of the variable inductor element.

In the transmission module 700 according to the second embodiment, different power supply voltages for the frequency bands of transmission signals are supplied to the amplifier 40, thereby enabling the amplifier 40 to operate under optimum conditions. In addition, different impedance matching conditions between the amplifier 40 and the amplifier 50 for the frequency bands of transmission signals are satisfied using the variable matching circuit 180, thereby enabling the amplifiers 40 and 50 to operate under optimum conditions. The variable matching circuit 180 can satisfy different impedance matching conditions between the amplifier 40 and the amplifier 50 for the frequency bands of transmission signals by adjusting the capacitance value of the variable capacitor element C5. This eliminates the need to adjust both the inductance value of a variable inductor element and the capacitance value of the variable capacitor element C5. Thus, the circuit configuration of the variable matching circuit 180 can be simplified.

Figure 8:
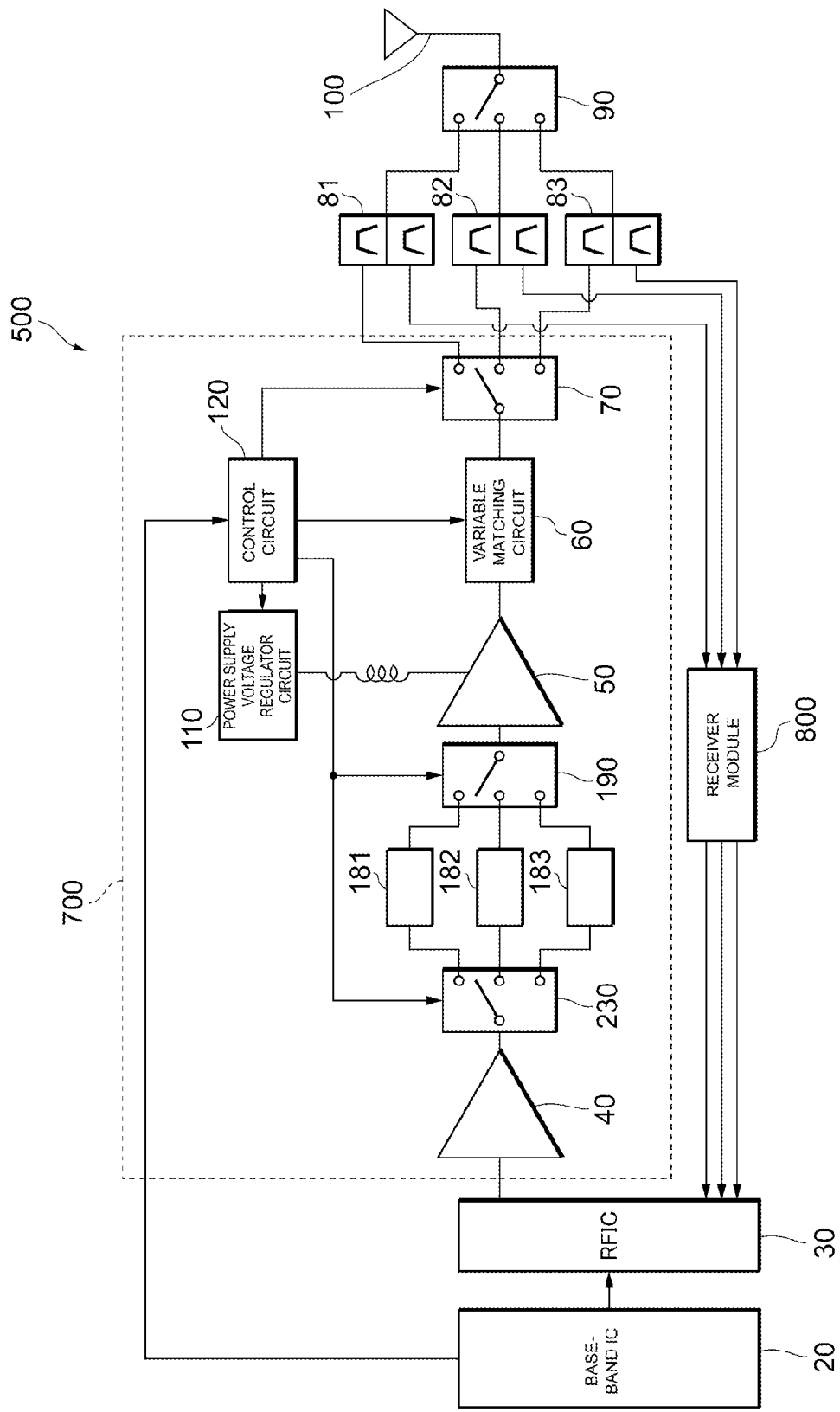
FIG. 8 illustrates a circuit configuration of a transmission and reception module according to a fourth embodiment of the present disclosure.

The power supply voltage regulator circuit 170 and the variable matching circuit 180 may be included in the transmission and reception modules 10 illustrated in FIGS. 4 and 5 or may be included in transmission and reception modules 500 and 600 illustrated in FIG. 8 and FIG. 9.

Figure 7:
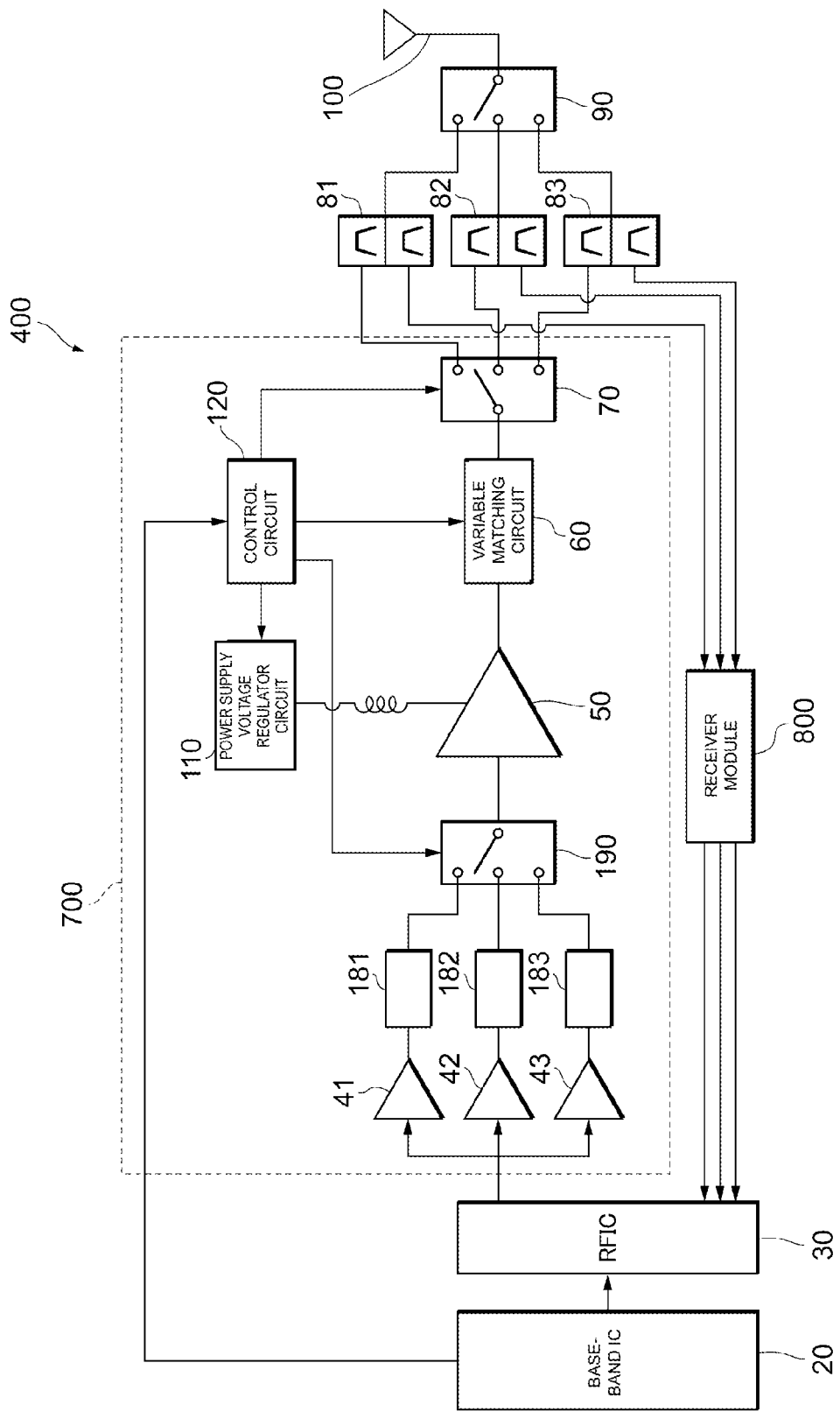
FIG. 7 illustrates a circuit configuration of a transmission and reception module according to a third embodiment of the present disclosure.

FIG. 7 illustrates the circuit configuration of a transmission and reception module 400 according to a third embodiment of the present disclosure. The same numerals as those illustrated in FIG. 1 are used to indicate the same or substantially the same circuit elements, and the following description focuses on the difference between the first and third embodiments. A transmission module 700 according to the third embodiment is different from the transmission module 700 according to the first embodiment in that the transmission module 700 according to the third embodiment includes a plurality of amplifiers 41, 42, and 43 serving as driver stage amplifiers, a plurality of inter-stage matching circuits 181, 182, and 183, and a band switch 190.

The amplifier 41 and the inter-stage matching circuit 181 are optimally designed in advance to amplify the first transmission signal in the first frequency band. The control circuit 120 outputs to the band switch 190 a control signal for switching a device to which the band switch 190 is connected so that the first transmission signal output from the RFIC 30 is input to the amplifier 50 via the amplifier 41 and the inter-stage matching circuit 181 on the basis of frequency information received from the baseband IC 20. In response to the control signal from the control circuit 120, the band switch 190 switches a device to which the band switch 190 is connected so that the amplifier 41 is selectively connected to the stage preceding the amplifier 50 via the inter-stage matching circuit 181 for amplifying the first transmission signal. The inter-stage matching circuit 181 matches impedance between the amplifier 41 and the amplifier 50.

The amplifier 42 and the inter-stage matching circuit 182 are optimally designed in advance to amplify the second transmission signal in the second frequency band. The control circuit 120 outputs to the band switch 190 a control signal for switching a device to which the band switch 190 is connected so that the second transmission signal output from the RFIC 30 is input to the amplifier 50 via the amplifier 42 and the inter-stage matching circuit 182 on the basis of frequency information received from the baseband IC 20. In response to the control signal from the control circuit 120, the band switch 190 switches a device to which the band switch 190 is connected so that the amplifier 42 is selectively connected to the stage preceding the amplifier 50 via the inter-stage matching circuit 182 for amplifying the second transmission signal. The inter-stage matching circuit 182 matches impedance between the amplifier 42 and the amplifier 50.

The amplifier 43 and the inter-stage matching circuit 183 are optimally designed in advance to amplify the third transmission signal in the third frequency band. The control circuit 120 outputs to the band switch 190 a control signal for switching a device to which the band switch 190 is connected so that the third transmission signal output from the RFIC 30 is input to the amplifier 50 via the amplifier 43 and the inter-stage matching circuit 183 on the basis of frequency information received from the baseband IC 20. In response to the control signal from the control circuit 120, the band switch 190 switches a device to which the band switch 190 is connected so that the amplifier 43 is selectively connected to the stage preceding the amplifier 50 via the inter-stage matching circuit 183 for amplifying the third transmission signal. The inter-stage matching circuit 183 matches impedance between the amplifier 43 and the amplifier 50.

In the transmission module 700 according to the third embodiment, each of the amplifiers 41, 42, and 43 can be selectively connected to the stage preceding the amplifier 50 via the corresponding one of the inter-stage matching circuits 181, 182, and 183 that are determined in advance in accordance with the frequency band of the transmission signal. This configuration enables the amplifiers 41, 42, and 43 in the driver stage and the amplifier 50 in the output stage to operate under optimum conditions.

The amplifiers 41, 42, and 43 and the inter-stage matching circuits 181, 182, and 183 may be included in place of the amplifier 40 in the transmission and reception modules 10 illustrated in FIGS. 4 and 5 or may be included in place of an amplifier 40 in the transmission and reception module 600 illustrated in FIG. 9.

FIG. 8 illustrates the circuit configuration of a transmission and reception module 500 according to a fourth embodiment of the present disclosure. The same numerals as those illustrated in FIG. 1 are used to indicate the same or substantially the same circuit elements, and the following description focuses on the difference between the first and fourth embodiments. A transmission module 700 according to the fourth embodiment is different from the transmission module 700 according to the first embodiment in that the transmission module 700 according to the fourth embodiment includes a plurality of inter-stage matching circuits 181, 182, and 183 and a plurality of band switches 190 and 230.

The plurality of inter-stage matching circuits 181, 182, and 183 are optimally designed to match impedance between the amplifiers 40 and 50 for the frequency bands of the first, second, and third transmission signals, respectively. The band switches 190 and 230 selectively switch the connections between the band switches 190 and 230 and the inter-stage matching circuits 181, 182, and 183 so that the first, second, and third transmission signals output from the amplifier 40 are input to the amplifier 50 via the inter-stage matching circuits 181, 182, and 183, respectively.

The transmission module 700 according to the fourth embodiment includes in advance the plurality of inter-stage matching circuits 181, 182, and 183 that are optimally designed to match impedance between the amplifiers 40 and 50 for the frequency bands of the first, second, and third transmission signals, respectively. This configuration enables the amplifier 40 in the driver stage and the amplifier 50 in the output stage to operate under optimum conditions.

FIG. 9 illustrates the circuit configuration of a transmission and reception module 600 according to a fifth embodiment of the present disclosure. The same numerals as those illustrated in FIG. 1 are used to indicate the same or substantially the same circuit elements, and the following description focuses on the difference between the first and fifth embodiments. The transmission and reception module 600 is different from the transmission and reception module 10 according to the first embodiment in that the transmission and reception module 600 includes a variable duplexer 200 in place of the band switch 70, the duplexers 81, 82, and 83, and the antenna switch 90 in the transmission and reception module 10 according to the first embodiment. The variable duplexer 200 includes a transmission filter 210 and a reception filter 220. The transmission filter 210 exhibits different frequency characteristics for the frequency bands of selected transmission signals such that the frequency band of a transmission signal selected from among the first, second, and third transmission signals is the pass band of the transmission filter 210 and the frequency bands of the unselected transmission signals are the stop bands of the transmission filter 210. The reception filter 220 exhibits different frequency characteristics for the frequency bands of selected reception signals such that the frequency band of a reception signal selected from among the first, second, and third reception signals is the pass band of the reception filter 220 and the frequency bands of the unselected reception signals are the stop bands of the reception filter 220. The control circuit 120 outputs a control signal to the variable duplexer 200 so that the selected transmission signal and reception signal pass through the variable duplexer 200 on the basis of frequency information received from the baseband IC 20. In response to the control signal from the control circuit 120, the variable duplexer 200 changes the frequency characteristics so that the pass band coincides with the frequency band of each of the selected transmission signal and reception signal. The transmission filter 210 has a transmission signal input node connected to the amplifiers 40 and 50 via the variable matching circuit 60. The reception filter 220 has a reception signal output node connected to the RFIC 30 via the reception module 800. A common node of the transmission filter 210 and the reception filter 220 is connected to the antenna 100.

The transmission and reception module 600 according to the fifth embodiment is provided with the variable duplexer 200 that exhibits a different frequency characteristic for the frequency band of a transmission signal selected from among a plurality of transmission signals in such a manner as to allow the selected transmission signal to pass through the variable duplexer 200, and can thus have a simple circuit configuration.

In the transmission and reception modules 10 illustrated in FIGS. 4 and 5, the variable duplexer 200 may be used in place of the band switch 70, the duplexers 81, 82, and 83, and the antenna switch 90. Likewise, in the transmission and reception module 300 illustrated in FIG. 6, the variable duplexer 200 may be used in place of the band switch 70, the duplexers 81, 82, and 83, and the antenna switch 90. Also, in the transmission and reception module 400 illustrated in FIG. 7, the variable duplexer 200 may be used in place of the band switch 70, the duplexers 81, 82, and 83, and the antenna switch 90.

The embodiments described above are intended to help easily understand the present disclosure, and are not to be used to construe the present disclosure in a limiting fashion. Various modifications or improvements can be made to the present disclosure without necessarily departing from the gist of the present disclosure, and equivalents thereof are also included in the present disclosure. That is, the embodiments may be appropriately modified in design by those skilled in the art, and such modifications also fall within the scope of the present disclosure so long as the modifications include the features of the present disclosure. The elements included in the embodiments and the arrangement, materials, conditions, shapes, sizes, and the like thereof are not limited to those described in the illustrated examples but can be modified as appropriate. For instance, the expression "circuit element A is connected to circuit element B" is used to include not only the case where the circuit element A is connected directly to the circuit element B but also the case where a signal path can be established between the circuit element A and the circuit element B via a circuit element C. Additionally, the positional relationships between elements, such as above, below, right-of, and left-of, are not limited by the dimensional ratios of the elements illustrated in the drawings, unless otherwise stated. Furthermore, the elements included in the embodiments can be combined as much as technically possible, and such combinations of elements also fall within the scope of the present disclosure so long as the combinations of elements include the features of the present disclosure.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A transmission module comprising:
   a first amplifier configured to amplify a plurality of transmission signals in different frequency bands;
   a first power supply voltage regulator circuit configured to supply a power supply voltage to the first amplifier, the power supply voltage to the first amplifier depending on a frequency band of a transmission signal being amplified by the first amplifier; and
   a first variable matching circuit having at least one variable capacitor element and not having any variable inductor elements,
   wherein the first variable matching circuit is configured to satisfy output impedance matching conditions of the first amplifier based on the frequency band of the transmission signal being amplified by changing a capacitance value of the at least one variable capacitor element based on a change in the output impedance matching conditions of the first amplifier in response to a change in the power supply voltage supplied to the first amplifier.

2. The transmission module according to claim 1, further comprising:
   a second amplifier connected to and preceding the first amplifier;
   a second power supply voltage regulator circuit configured to supply a power supply voltage to the second amplifier, the power supply voltage to the second amplifier depending on a frequency band of a transmission signal being amplified by the second amplifier; and
   a second variable matching circuit having at least one variable capacitor element and not having any variable inductor elements,
   wherein the second variable matching circuit is configured to satisfy impedance matching conditions between the second amplifier and the first amplifier based on the frequency band of the transmission signal being amplified by the second amplifier by changing a capacitance value of the at least one variable capacitor element of the second impedance matching circuit based on a change in the impedance matching conditions between the second amplifier and the first amplifier in response to a change in the power supply voltage supplied to the second amplifier.

3. A transmission and reception module comprising:
   the transmission module according to claim 2; and
   a variable duplexer that exhibits frequency characteristics according to the frequency band of the transmission signal being amplified such that the frequency band of the transmission signal being amplified is within a passband of the variable duplexer.

4. The transmission module according to claim 1, further comprising:
   a second amplifier connected to and preceding the first amplifier;
   a second power supply voltage regulator circuit configured to supply a power supply voltage to the second amplifier, the power supply voltage to the second amplifier depending on a frequency band of a transmission signal being amplified by the second amplifier; and
   a second variable matching circuit having at least one variable inductor element and not having any variable capacitor elements,
   wherein the second variable matching circuit is configured to satisfy impedance matching conditions between the second amplifier and the first amplifier based on the frequency band of the transmission signal being amplified by the second amplifier by changing an inductance value of the at least one variable inductor element of the second impedance matching circuit based on a change in the impedance matching conditions between the second amplifier and the first amplifier in response to a change in the power supply voltage supplied to the second amplifier.

5. A transmission and reception module comprising:
   the transmission module according to claim 4; and
   a variable duplexer that exhibits frequency characteristics according to the frequency band of the transmission signal being amplified such that the frequency band of the transmission signal being amplified is within a passband of the variable duplexer.

6. The transmission module according to claim 1, further comprising:
   a plurality of second amplifiers, each one of the second amplifiers being selectively connectable to and preceding the first amplifier via a corresponding one of a plurality of inter-stage matching circuits,
   each one of the inter-stage matching circuits being associated with a frequency band of a transmission signal amplified by the corresponding one of the second amplifiers.

7. A transmission and reception module comprising:
   the transmission module according to claim 6; and
   a variable duplexer that exhibits frequency characteristics according to the frequency band of the transmission signal being amplified such that the frequency band of the transmission signal being amplified is within a passband of the variable duplexer.

8. A transmission and reception module comprising:
   the transmission module according to claim 1; and
   a variable duplexer that exhibits frequency characteristics according to the frequency band of the transmission signal being amplified such that the frequency band of the transmission signal being amplified is within a passband of the variable duplexer.

9. The transmission module according to claim 1, further comprising:
   a band switch that directs the transmission signal being amplified to an antenna,
   wherein the at least one first variable capacitor element and the band switch are on a same semiconductor substrate.

10. The transmission module according to claim 1, wherein
the first power supply voltage regulator circuit is configured to boost a battery voltage to the power supply voltage, the power supply voltage being greater than the battery voltage.

* * * * *